United States Patent
Sato

(10) Patent No.: US 8,411,394 B2
(45) Date of Patent: Apr. 2, 2013

(54) MAGNETO RESISTIVE EFFECT ELEMENT WITH A MAGNETIC FILM GENERATING SPIN FLUCTUATION OF CONDUCTION ELECTRONS

(75) Inventor: Rie Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/457,080

(22) Filed: Jun. 1, 2009

(65) Prior Publication Data

US 2009/0244788 A1  Oct. 1, 2009

Related U.S. Application Data

(62) Division of application No. 11/202,334, filed on Aug. 12, 2005, now abandoned.

(30) Foreign Application Priority Data

Aug. 17, 2004 (JP) ................................. 2004-237463

(51) Int. Cl.
*G11B 5/33* (2006.01)

(52) U.S. Cl. ........................................................ 360/324

(58) Field of Classification Search ........................ None
See application file for complete search history.

(56) References Cited

U.S. PATENT DOCUMENTS 6,798,624 B2   9/2004 Covington et al.
7,522,389 B2 *  4/2009 Sbiaa et al. ................ 360/324.1
2002/0131214 A1  9/2002 Covington et al.

FOREIGN PATENT DOCUMENTS

| JP | 7-45884 | 2/1995 |
|----|---------|--------|
| JP | 11-213650 | 8/1999 |
| JP | 2002-261352 | 9/2002 |
| JP | 2003-229612 | 8/2003 |

OTHER PUBLICATIONS

R. Sato, et al. "Resonating Magnetoresistance Induced by the Injection of Spin Fluctuation", Journal of Magnetism and Magnetic Materials 279, 2004, pp. 36-40.
Office Action mailed on Aug. 27, 2010, in Japanese Patent Application No. 2005-225715.
Office Action issued May 19, 2011, in Japanese Patent Application No. 2005-225715 (with English-language Translation).

* cited by examiner

*Primary Examiner* — David D Davis
(74) *Attorney, Agent, or Firm* — Oblon, Spivak, McClelland, Maier & Neustadt, L.L.P.

(57) ABSTRACT

The present invention is to be capable of suppressing magnetic white noises as far as possible. A resonant magnetoresistance effect element includes a first magnetic layer whose magnetization direction is substantially parallel to a film plane, a second magnetic film whose magnetization direction is substantially perpendicular to the film plane, and a non-magnetic layer which is provided between the first and second layers.

13 Claims, 12 Drawing Sheets

MAGNETO RESISTIVE EFFECT ELEMENT WITH A MAGNETIC FILM GENERATING SPIN FLUCTUATION OF CONDUCTION ELECTRONS

CROSS-REFERENCE TO RELATED APPLICATION

This application is a divisional of U.S. application Ser. No. 11/202,334 filed Aug. 12, 2005, and is based upon and claims the benefit of priority from prior Japanese Patent Application No. 2004-237463 filed on Aug. 17, 2004 in Japan, the entire contents of which are incorporated herein by reference.

BACKGROUND OF THE INVENTION

1. Field of the Invention

The present invention relates to a magnetic oscillator, a magnetic head, and a magnetic recording and reproducing apparatus.

2. Related Art

Since advent of a GMR (giant magneto-resistance) head utilizing a giant magneto-resistance effect (GMR effect), a recording density in magnetic recording has improved at 100% annually. The GMR element is constituted of a stacked film having a sandwich structure of a ferromagnetic layer/a non-magnetic layer/a ferromagnetic layer. The GMR element is a device utilizing a magneto-resistance effect of a so-called spin valve film, which is constituted such that magnetization of one of the ferromagnetic layers is pinned by application of exchange bias to the one and a magnetization direction of the other thereof is changed by applying external magnetic field thereto, so that change in an angle defined between the magnetization directions of the two ferromagnetic layers is detected as a change in resistance value. There have been developed a CIP (current in plane)-GMR element which causes current to flow in a film plane of a spin valve film to detect a resistance change and a CPP (current perpendicular to plane)-GMR element which causes current to flow perpendicularly to a film plane of a spin valve film to detect a resistance change. Both the CIP-GMR element and the CPP-GMR element have a magneto-resistance ratio (MR ratio) of several % or so, and it is considered that both the elements can accommodate a recording density of about 200 Gbit/inch$^2$.

In order to accommodate magnetic recording at a higher density, development of a TMR element utilizing a tunneling magneto-resistance effect (TMR effect) has proceeded. The TMR element comprises a stacked film of a ferromagnetic layer/an insulating layer/a ferromagnetic layer, and it causes a tunnel current to flow in the insulating layer on application of a voltage between the ferromagnetic layers. The TMR element is an element which utilizes such a fact that the magnitude of a tunnel current is changed according to the magnetization directions of the upper and lower ferromagnetic layers to detect change of an angle defined by the magnetization directions as a tunnel resistance value. A TMR element having an MR ratio up to about 50% has been obtained. Since the TMR element has a MR ratio larger than that of the GMR element, its signal voltage becomes larger.

However, there is such a problem that not only a pure signal component but also a noise component due to a shot noise become large, and an S/N ratio (a signal-noise ratio) is not improved. The shot noise is caused by current fluctuation generated due to irregular passing of electrons through a tunnel barrier, and it increases in proportion to square root of a tunnel resistance value. In order to suppress the shot noise and obtain a required signal voltage, therefore, it is necessary to make a tunnel insulating layer thin to lower a tunnel resistance.

Since it is necessary to reduce a device size to a size corresponding to a recording bit or so according to increase in recording density, it is necessary to lower a junction resistance of a tunnel insulating layer, namely, make the insulating layer thin, according to increase in density. A junction resistance of 1Ω·cm$^2$ or less is required in a recording density of 300 Gbit/inch$^2$ and therefore a tunnel insulating layer with a thickness corresponding to a thickness of two atoms must be formed in terms of a film thickness of an Al—O (aluminum oxide film) tunnel insulating layer. Since shortage between the upper and lower electrodes becomes easier to occur according to thinning of the tunnel insulating layer, which leads to reduction of a MR ratio, it becomes exponentially difficult to manufacture an element. Therefore, the limit of the TMR element is estimated to be 300 Gbit/inch$^2$.

The respective elements described above utilize the magneto-resistance effect in a broad sense, but a problem about a magnetic white noise common to these elements has emerged suddenly in recent years. Since the noise is different from an electric noise such as the shot noise described above and is due to thermal fluctuation of magnetization, it is thought that the noise becomes more dominant according to fineness of an element so that the white noise outstrips the electric noise in an element corresponding to 200 Gbpis to 300 Gbpsi. In order to avoid the magnetic white noise and further increase a recording density in magnetic recording, a fine magnetic sensor operating based upon a principle different from the conventional magneto-resistance effect is required, and development of a resonant magneto-resistance effect element has proceeded as such a magnetic sensor (for example, see R. Sato, et. al. J. Magn. Magn. Mat. Vol. 279, p. 36 (2004)).

A characteristic improvement of a conventional resonant magneto-resistance effect element has been promoted by using artificial anti-ferromagnetic material with reduced defects as a magnetic material in a structure where a non-magnetic layer with a thickness of 1 nm or less is sandwiched between ferromagnetic layers whose magnetization directions are perpendicular to a film plane. However, the artificial ferromagnetic material includes many difficult points for practical application due to necessity of a film forming technique with a high level. Therefore, sufficient characteristics can not be obtained currently.

As described above, though development of a novel magnetic sensor utilizing a resonant magneto-resistance effect has proceeded in order to solve the problem about the magnetic white noise adversely affecting the high density magnetic recording, sufficient characteristics for solving the problem have not been achieved yet.

SUMMARY OF THE INVENTION

The present invention has been made in view of the above circumstances, and an object thereof is to provide a resonant magneto-resistance effect element which can suppress magnetic white noises as far as possible.

A resonant magneto-resistance effect element according to a first aspect of the present invention includes: a first magnetic film whose magnetization direction is substantially parallel to a film plane; a second magnetic film whose magnetization direction is substantially perpendicular to the film plane, and a first non-magnetic film which is provided between the first and second magnetic films.

A resonant magneto-resistance effect element according to a second aspect of the present invention includes: a first and second magnetic films whose magnetization directions are substantially parallel to a film plane, and a stacked layer, the stacked layer being provided between the first and second magnetic films, the stacked layer comprising a plurality of sets of a third magnetic film whose magnetization direction is substantially perpendicular to the film plane and a non-magnetic film.

A magnetic head according to a third aspect of the present invention includes: a resonant magneto-resistance effect element above-mentioned as a reproducing element.

A magnetic recording and reproducing apparatus according to a fourth aspect of the present invention includes: a magnetic head above-mentioned.

DESCRIPTION OF THE EMBODIMENTS

Figure 1:
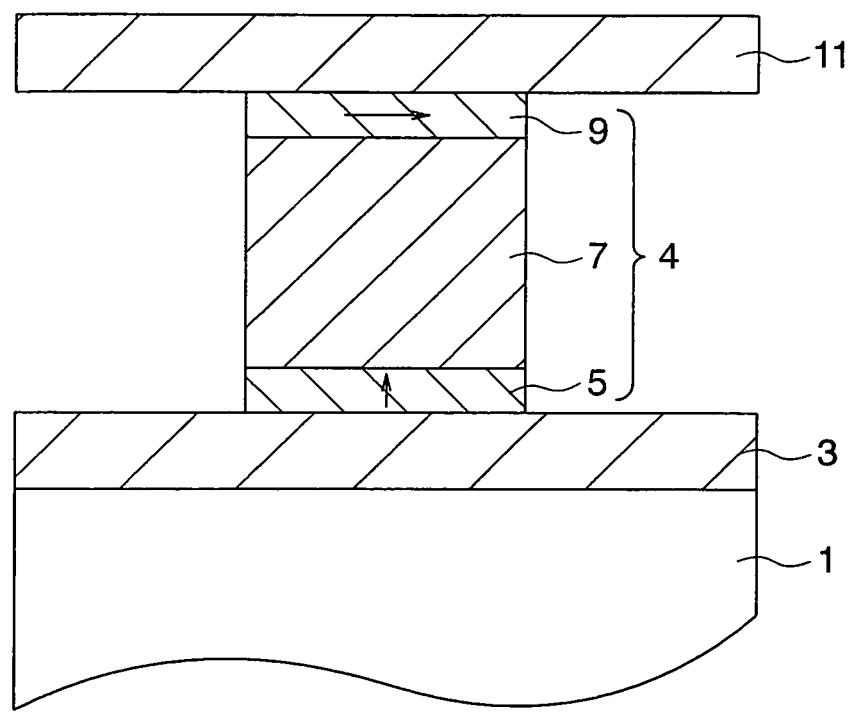
FIG. 1 is a sectional view showing a resonant magneto-resistance effect element according to a first embodiment of the present invention.

A resonant magneto-resistance effect element, which is a kind of a magnetic oscillator, will be first explained prior to explanation about embodiments of the present invention. The resonant magneto-resistance effect element is configured to utilize thermal fluctuation of magnetization in soft magnetic material positively and it is characterized by injecting spin fluctuation of conduction electrons caused by thermal fluctuation of magnetization in ferromagnetic material into magnetic material. The spin fluctuation of the conduction electrons injected acts on the magnetic material as an effective high frequency magnetic field via interaction such as sd exchange interaction to induce magnetic resonance in the magnetic material. When an external magnetic field varies and magnetization fluctuation of ferromagnetic material changes, intensity of magnetic resonance induced in the magnetic material also changes, but the change is detected as change in effective electric resistance of the magnetic material. According to such a principle, a device resistance change in a range of several tens % to several hundreds % can be obtained in response to change in external magnetic field of about 10 Oe (oersted), so that the resonant magneto-resistance effect element functions as a fine magnetic sensor with a high sensitivity.

Embodiments of the present invention will be explained below in detail with reference to the drawings. In the following explanation, same or common constituents or parts are denoted by same reference numerals and double explanation thereof is omitted. Respective figures are illustrative ones, where a shape, a size, a ratio, or the like different from ones in an actual apparatus may be included. Therefore, proper modifications can be adopted in manufacture of an actual device or the like, referring to the following explanation and known techniques.

First Embodiment

A resonant magneto-resistance effect element according to a first embodiment of the present invention is shown in FIG. 1. FIG. 1 is a sectional view showing the resonant magneto-resistance effect element according to the embodiment. The resonant magneto-resistance effect element according to the embodiment is provided on a substrate 1 with a lower electrode 3 also serving as a magnetic shield, a ferromagnetic layer 5 which is provided on the lower electrode 3 and whose magnetization direction is substantially perpendicular to a film plane, a non-magnetic layer 7 which is provided on the ferromagnetic layer 5, a ferromagnetic layer 9 which is provided on the non-magnetic layer 7 and whose magnetization direction is substantially parallel to the film plane, and an upper layer 11 which is provided on the ferromagnetic layer 9 and also serves as a magnetic shield. The ferromagnetic layer 5, the non-magnetic layer 7, and the ferromagnetic layer 9 have the same plan shape to constitute one stacked film 4. A magnetization direction of the ferromagnetic layer 5 is substantially perpendicular to the film plane, namely, its easy axis of magnetization is substantially perpendicular to the film plane, while a magnetization direction of the ferromagnetic layer 9 is substantially parallel to the film plane, namely, its easy axis of magnetization is substantially parallel to the film plane. In the present specification, "substantially parallel" means a state including an inclined state at an angle of inclination of −15 degree to +15 degree from the perfectly parallel state, and "substantially perpendicular" means a state including an inclined state at an angle of inclination of −15 degree to +15 degree from the perfectly perpendicular state.

Since the lower electrode 3 and the upper electrode 11 also serves as wiring, they extend in a lateral direction on a drawing sheet for FIG. 1 and their ends are connected to a current supply circuit for controlling current flowing in the element, a reading (sensing) circuit, and the like. Incidentally, the lower electrode 3 and the upper electrode 11 also serves as wiring and magnetic shield, but the wiring and/or magnetic shield may be provided independently from the lower electrode and/or the upper electrode. In this case, the magnetic shield or the wiring may be formed within a film plane (a plane extending in left and right directions on the sheet plane in a sectional view shown in FIG. 1) parallel to the film plane of the lower electrode 3, the upper electrode 11, and the ferromagnetic layer 9.

The resonant magneto-resistance effect element according to the embodiment positively utilizes thermal fluctuation of magnetization inevitable in ferromagnetic material. That is, spin fluctuation of conduction electrons due to thermal fluctuation of magnetization of the ferromagnetic layer 9 is injected into the ferromagnetic layer 5 via the non-magnetic layer 7. The spin fluctuation of the conduction electrons injected acts as an effective high frequency magnetic field applying spin torque in the ferromagnetic layer 5 via sd exchange interaction to induce magnetic resonance on the ferromagnetic layer 5 at a threshold current $I_{th}$ or more. When fluctuation spectrum of magnetization of the ferromagnetic layer 9 varies according to change of external magnetic field, intensity of magnetic resonance induced in the ferromagnetic layer 5 changes, and the change in intensity is detected as an effective electric resistance in the resonant magneto-resistance effect element. According to such a principle, a device resistance change in a range of several hundreds % to several thousands % is obtained in response to change in external magnetic field of several tens Oe.

Thus, the resonant magneto-resistance effect element according to the embodiment functions as a fine magnetic sensor with a high sensitivity. Since the resonant magneto-resistance effect element according to the embodiment utilizes thermal fluctuations of magnetizations of the ferromagnetic layer 9 and the ferromagnetic layer 5, as described later, it has a feature that a sensitivity and an SN ratio hardly decrease, even if the joined area of the device (joined areas among the ferromagnetic layer 5, the non-magnetic layer 7, and the ferromagnetic layer 9) decreases. Therefore, when the resonant magneto-resistance effect element according to the embodiment is applied to a magnetic head for magnetic information reproduction, the magnetic head can accommodate a ultra-high density recording where recording density exceeds several hundreds Gbpsi to 1 Tbpsi.

In the embodiment, the ferromagnetic layer 9 is set to have a flat area of about 30×30 nm² and a thickness of about 1 nm, assuming a reading magnetic head accommodating 1 Tb/inch² as one example of a ferromagnetic layer. Incidentally, flat areas of the ferromagnetic layer 5 and the non-magnetic layer 7 may be set to the same as that of the ferromagnetic layer 9. That is, the joined area of the resonant magneto-resistance effect element according to the embodiment is about 30×30 nm². In the embodiment, the stacked film 4 constituted of the ferromagnetic layer 5, the non-magnetic layer 7, and the ferromagnetic layer 9 is formed in a column shape with a square bottom, and four side faces of the column are surrounded by non-magnetic insulating material (not shown). The shape of the stacked film 4 may be properly modified in another shape such as a circular cylinder with a circular bottom face, a triangle pole with a triangular bottom face, or a polygon pole with a polygonal bottom face.

As material for the ferromagnetic layer 9, Fe, Co, Ni, or alloy thereof, Heusler's alloy such as $Cu_2MnAl$, $Ni_2MnIn$, $Cu_2MnIn$, $Cu_2MnSn$, $Ni_2MnSn$, or $Co_2MnSn$, electrically conductive magnetic compound such as $Fe_3O_4$, or $LaSrMnO_2$, can be used. As described with equations later, however, since magnitude of thermal fluctuation of magnetization is inversely proportional to a volume of a magnetic material and square root of magnetization, it is desirable to use a ferromagnetic material with magnetization of 1000 G or less and a thickness of 0.1 nm or more and 3 nm or less. As material for the non-magnetic layer 7, a noble metal such as Al, Pt, Au, Ag, or Cu, non-magnetic transition metal such as Cr, Ru, or Pd, or the like can be used. A thickness of the non-magnetic layer 7 may be set to a range of about 1 nm to several tens nm, for example, to about 5 nm. The non-magnetic layer 7 serves to cut off an exchange interaction acting between the ferromagnetic layer 9 and the ferromagnetic layer 5 and simultaneously transport spin fluctuation of conduction electrons generated in the ferromagnetic layer 9 to the ferromagnetic layer 5.

As material for the ferromagnetic layer 5, for example, hexagonal Co or the like can be used. When Co is used, a perpendicular anisotropy magnetic field (perpendicular anisotropy constant) thereof can be changed by controlling a kind or a film thickness of a basic metal. In order that the ferromagnetic layer 5 resonates magnetic fluctuation of several GHz to several tens GHz, it is desirable that intensity of a perpendicular anisotropy magnetic field is 1 kOe or more. As the material for the ferromagnetic layer 5, CoCr base alloy such as CoCrTa, CoCrTaPt, or CoCrTaNb, a Co multi-layer film such as Co/Pd, Co/Pt, or Co—Cr—Ta/Pd, CoCrPt base alloy or FePt base alloy, or SmCo base metal or TbFeCo alloy including earth rare metal may be utilized instead of Co. A thickness of the ferromagnetic layer 5 is preferably 0.1 nm or more and 3 nm or less because of the reason described later.

As material for the lower electrode 3 and the upper electrode 11, metal such as Al, Cu, Au, Ag, or Ru can be used. Especially, when Co is used as material for the ferromagnetic layer 5, it is preferable that Ru is used. When the lower electrode 3 and the upper electrode 11 also serve as magnetic shields, a stacked film including a film made from the above metal and a known shield material film such as NiFe is formed. Incidentally, as material for the substrate 1, non-magnetic insulating substrate material suitable for forming a magnetic element such as silicon, $SiO_2$, $Al_2O_3$, TiC is used.

Figure 2A:
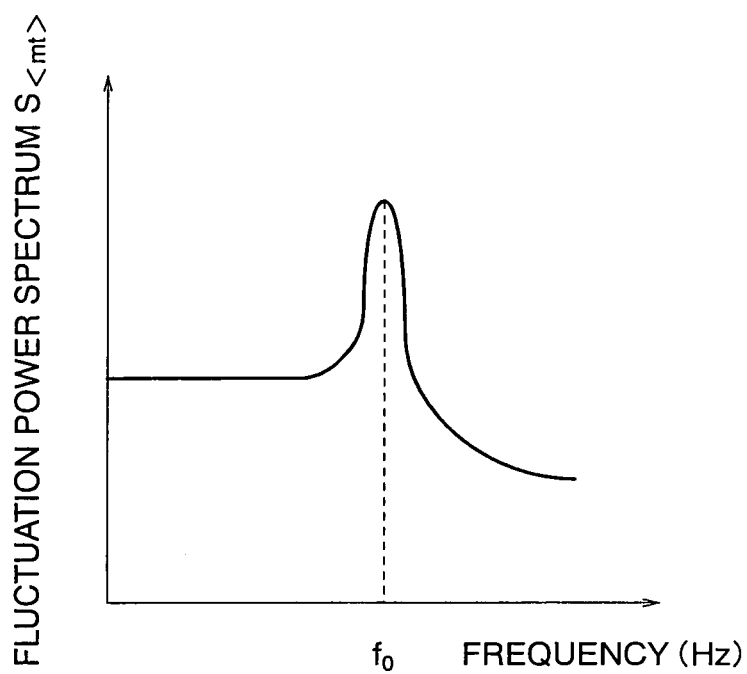
FIG. 2A is a graph illustratively showing a power spectrum $S_{<mt>}$ of thermal fluctuation in a ferromagnetic layer.
Figure 2B:
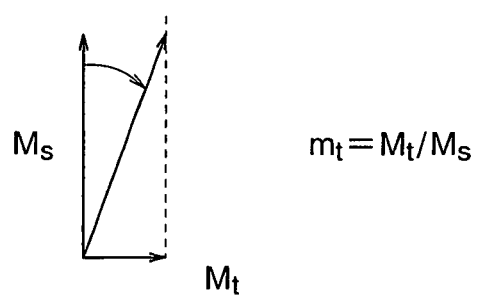
FIG. 2B is a diagram showing a magnetization component in a film plane of the ferromagnetic layer.

Next, thermal fluctuation of magnetization of the ferromagnetic layer 9 will be explained. FIG. 2A is a graph illustratively showing power spectrum $S_{<mt>}$ of thermal fluctuation of magnetization of the ferromagnetic layer 9. FIG. 2B is a diagram showing a magnetization component within film plane of the ferromagnetic layer 9, where Ms denotes saturated magnetization of the ferromagnetic layer 9 and Mt denotes a lateral component orthogonal to the saturated magnetization of the ferromagnetic layer 9. The "$m_t$" which is a ratio of Mt to the saturated magnetization Ms represents a radian of thermal fluctuation of magnetization of the ferromagnetic layer 9. Thermal fluctuation of magnetization of the ferromagnetic layer 9 at a temperature T (Kelvin) is approximately expressed as the following Equation (1) using a power spectrum $S_{<mt>}$ of mean square $<m_t^2>$ of $m_t$ ($=M_t/M_s$).

$$\begin{aligned}
\langle m_t^2 \rangle &= \int S_{\langle m_t \rangle} df \\
S_{\langle m_t \rangle} &= \frac{2kT}{\pi f} \frac{\chi''_{FM}}{M_s^2 V_{FM}} \\
\chi''_{FM} &\cong (\gamma/2\pi)(4\pi M_s)(\alpha f) \frac{f^2 + (\gamma/2\pi)^2 (4\pi M_s)^2}{(f_{FM}^2 - f^2)^2 + (\gamma/2\pi)^2 (4\pi M_s)^2 (\alpha f)^2} \\
f_{FM} &= (\gamma/2\pi)\sqrt{4\pi M_s (H + H_K)}
\end{aligned} \quad (1)$$

In Equation (1), $\chi_{FM}''$ represents an imaginary part of a high frequency susceptibility of the ferromagnetic layer 9, $V_{FM}$ represents a volume of the ferromagnetic layer 9, $\alpha$ represents Gilbert's damping coefficient, $\gamma$ ($=19\times10^6$ rad/sOe) represents a gyro magnetic ratio, $f_{FM}$ represents a resonant frequency of the ferromagnetic layer 9, H represents external magnetic field received by the ferromagnetic layer 9, and $H_K$ represents anisotropy magnetic field of the ferromagnetic layer 9. It will be understood from Equation (1) and FIG. 2A that the high frequency susceptibility $\chi_{FM}''$ increases and the power spectrum $S_{<mt>}$ of the magnetization fluctuation of the ferromagnetic layer 9 also increases when the frequency f is in the vicinity of the resonant frequency $f_{FM}$. A value at a peak frequency $f_{FM}$ of $S_{<mt>}$ is in inverse proportion to the volume $V_{FM}$ and the saturated magnetization $M_s$. When permalloy (saturated magnetization $M_s$=800 Gauss) with the volume $V_{FM}$ of about 30×30×1 $nm^3$ is used as the ferromagnetic layer 9, adopting the resonant frequency $f_{FM}$=10 GHz and Gilbert's damping coefficient $\alpha$=0.01, the thermal fluctuation $<m_t^2>^{1/2}$ of magnetization of the ferromagnetic layer 9 corresponding to the external magnetic field frequency f=$f_{FM}$ and a bandwidth $\Delta f$ is expressed by the following Equation (2).

$$\sqrt{<m_t^2>} = \sqrt{S_{<mt>}(f_0)\Delta f} = 2.4 \text{ radian} = 14° \quad (2)$$

Here, the bandwidth $\Delta f$ is a full half bandwidth of a resonant line of the ferromagnetic layer 9, and it is expressed as follows.

$$\Delta f \cong (\gamma/2\pi)(4\pi M_s)\alpha$$

Here, $\Delta f$=5.6×$10^8$ Hz is obtained.

Spin fluctuation due to thermal fluctuation of magnetization of the ferromagnetic layer 9 occurs in conduction electrons in the ferromagnetic layer 9 having such magnetization fluctuation. The conduction electrons having the spin fluctuation are transported by current flowing into the stacked film 4 constituted of the ferromagnetic layer 9/the non-magnetic layer 7/the ferromagnetic layer 5 to pass through the non-magnetic layer 7 to be injected into the ferromagnetic layer 5. The spin fluctuation of the conduction electrons injected applies a high frequency torque (effective high frequency magnetic field) to the ferromagnetic layer 5 via sd exchange interaction or the like to induce magnetic resonance in the ferromagnetic layer 5. The torque applied to the magnetic material by the spin s is expressed by the following equation (3).

$$N = M \times [h_1(\hat{M} \times \hat{s}) + h_2 \hat{s}] \quad (3)$$
$$= M \times h$$

In the Equation (3), a thick letter M denotes a magnetization vector of the ferromagnetic layer 5, and M hat and s hat denote unit vectors in the direction of M and in the direction of the spin s, respectively. Equation h=$(h_1^2+h_2^2)^{1/2}$ represents magnitude of an effective magnetic field. The h depends on current density j, spin polarizability p of current, thickness d of the ferromagnetic layer 5, and magnetization which is magnitude M of a magnetization vector. The thinner the thickness d and the smaller the magnetization M, the larger h becomes. Therefore, it is desirable that the thickness d is 0.1 nm or more and 3 nm or less and the magnetization M is 1000 G or less. The spin polarizability p of current is about 0.8, and h is about $10^{-4}$ j (Oe) under current density of j (A/$cm^2$) under conditions of d=1 nm and M=1000 G. From Equation (3), the power spectrum of a high frequency magnetic field produced by the spin fluctuation $<m_t^2>$ becomes G(f)=$h^2 S_{<mt>}$.

The imaginary portion of the susceptibility of the ferromagnetic layer 5 is expressed by the following Equation (4).

$$\chi_{PFM}'' = \frac{\left(\frac{\gamma}{2\pi}\right)(4\pi M)(\alpha' f)(f_0^2 + f^2)}{(f_0^2 - f^2)^2 + 4(\alpha' f f_0)^2} \quad (4)$$

$$f_0 = \left(\frac{\gamma}{2\pi}\right)(H_A - 4\pi M)$$

In Equation (4), $f_0$ represents a resonant frequency of the ferromagnetic layer 5, $H_A$ represents anisotropy magnetic field, and $\alpha'$ represents Gilbert's damping coefficient of the ferromagnetic layer 5. When Co of $H_A$–$4\pi M$=3500 (Oe) is used as material for the ferromagnetic layer 5, $f_0 \approx$10 GHz is obtained.

When thermal fluctuation of magnetization of the ferromagnetic layer 5, a direction of the magnetization being perpendicular to a film plane like an ordinary ferromagnetic resonance, is vanishingly small, if resonant frequencies of the ferromagnetic layer 5 and the ferromagnetic layer 9 are equal to each other, the above-described high frequency magnetic field induces magnetic resonance in the ferromagnetic layer 5 regardless of intensity thereof. In the current element, however, thermal fluctuation of the ferromagnetic layer 5 is large and is comparable in magnitude to that of the ferromagnetic layer 9. There is not correlation in phase between the thermal fluctuations of magnetizations of the ferromagnetic layer 9 and the ferromagnetic layer 5, and a correlation time in phase is about 1/($\alpha f_{FM}$)=1/($\alpha' f_{PFM}$). Therefore, when the high frequency magnetic field is small, energy absorption does not occur, taking time averaging. However, since the high frequency magnetic field increases in proportion to increase in current, motion of magnetization M of the ferromagnetic layer 5 is controlled by the high frequency magnetic field and its phase eventually becomes the same phase as the high frequency magnetic field, where energy absorption occurs. When the thickness sizes of the ferromagnetic layer 9 and the ferromagnetic layer 5 are equal to each other in case of h=$h_0 \cdot j$, a threshold current density where the resonant absorption occurs is expressed by Equation (5).

$$j_{th} = \frac{M_{FM}}{h_0 \sqrt{\chi_{FM}''(f_{FM})\chi_{PFM}''(f_{PFM})}} \quad (5)$$

In case of p=0.8, M=1000 G, and d=1 nm, estimation is made as $h_0$=1.4×$10^{-4}$ Oe/(A/$cm^2$), so that a critical current density $j_{th}$ becomes 2.8×$10^4$ A/$cm^2$. Since $h_0$ is inversely proportional to a film thickness of a magnetic layer, resonant absorption can be caused by a low threshold current density corresponding to reduction in film thickness. Since $h_0$ depends on the film thickness, the threshold current depends on the thicknesses of the ferromagnetic layer 9 and the ferromagnetic layer 5, but it does not depend on the device area, as understood from Equation (5).

Since the fluctuation of magnetization of the ferromagnetic layer 5 is in phase with that of the ferromagnetic layer 9 in phase under such a condition that the current density j is equal to or more than the critical current density $j_{th}$, the fluctuation of magnetization of the ferromagnetic layer 9 further increases due to the high frequency torque. That is, a feed forward loop is formed between motions of magnetization of the ferromagnetic layer 5 and magnetization of the ferromagnetic layer 9 in case of j>$j_{th}$, so that amplitude of the fluctuation is increased until it become approximately equal to the magnitude M of magnetization.

A resonant absorption power in the ferromagnetic layer 5 under such a condition that current density j is equal to or more than the critical current density $j_{th}$ can be evaluated by Equation (6).

$$W_{PFM} = \left\langle \frac{dE}{dt} \right\rangle$$

$$= -\left\langle M_{PFM}(t) \frac{d h_{PFM}^{hf}}{dt} \right\rangle V_{PFM}$$

$$\cong \frac{1}{2}(2\pi f_{PFM}) M h V_{PFM} \quad (6)$$

When M=1000 G, $V_{PFM}$=30×30×1 nm$^3$, and h=1.4×10$^{-4}$× jOe are assigned, absorption in j=$j_{th}$=2.8×10$^4$ A/cm$^2$ becomes $W_{PFM}$=1.1×10$^{-4}$ erg/s=1.1×10$^{-11}$ watts. Taking in such an effect that a high frequency torque according to fluctuation of magnetization in the ferromagnetic layer 5 acting on the ferromagnetic layer 9 and adding absorption equal in amount to that of the ferromagnetic layer 9 thereto, W=2.2×10$^{-11}$ watts is obtained as absorption W of the whole element. A element voltage and a device resistance become ΔV=W/Ith=8.8×10$^{-4}$ V and ΔR=ΔV/$I_{th}$=350Ω in case of I≈$I_{th}$=$j_{th}$·A=2.5×10$^{-7}$ A because of a flat area of the element A=30×30 nm$^2$. Since the absorption power in I>$I_{th}$ increases in proportion to current as W=0.88×10$^{-5}$I, ΔV remains constant. When an interference resistance is 1.0×10$^{-11}$ Ωcm$^2$ and a mean bulk resistance is 5×10$^{-6}$ Ωcm, a resistance $R_0$ at a time of non-resonance is about 5Ω, so that ΔR ($I_{th}$)/$R_0$~70 (7000%) is obtained.

A peak frequency $f_{FM}$ of the power spectrum fluctuation of magnetization of a fine magnetic material changes due to change δH in external magnetic field from Equation (1) to the following Equation (7), but a resonant frequency of a perpendicularly magnetized film remains H<<$H_A$=3500 Oe and it hardly changes.

$$\delta f_{FM} \cong \frac{1}{2} \frac{(\gamma/2\pi)^2 4\pi M_s}{f_{FM}} \delta H \quad (7)$$

That is, when the element is applied with external magnetic field, it changes from its resonant state to its non-resonant state, and an output voltage ΔV thereof decreases.

Figure 3:
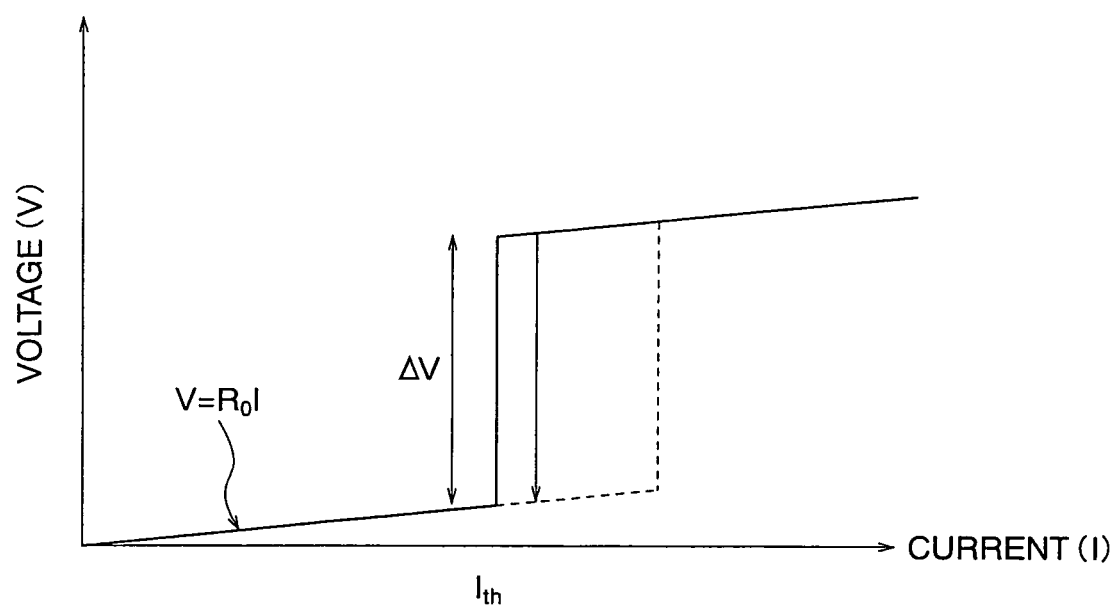
FIG. 3 is a graph showing a device characteristic of the resonant magneto-resistance effect element according to the first embodiment.

A characteristic of the resonant magneto-resistance effect element according to the embodiment is shown in FIG. 3. When external magnetic field changes and the resonant magneto-resistance effect element changes from the resonant state to the non-resonant state, a threshold current changes, as shown with a dotted line, and an output voltage changes largely, as shown by arrow.

Though the resonant magneto-resistance effect element according to the embodiment utilizes thermal fluctuation of magnetization, a characteristic of the fluctuation depends on a relative magnitude between thermal fluctuation of the ferromagnetic layer 9 and thermal fluctuation of the ferromagnetic layer 5 perpendicular to a film plane. Therefore, the element functions without depending on a element size as far as each film has a single magnetic domain. However, the smaller the size of the magnetic material, the more easily a magnetic layer with a single magnetic domain structure can be obtained. Accordingly, it is desirable that the element has a element size of 1 μm$^2$ or less. Since a temperature dependency of the characteristic is small in a temperature range in which a cut-off frequency kT/h (k: Boltzmann constant, T: temperature, h: Planck's constant) of thermal fluctuation is sufficiently high as compared with the resonant frequency, the resonant magneto-resistance effect element generally operates even in a low temperature range where the thermal fluctuation becomes small.

Next, electric and magnetic noises in the resonant magneto-resistance effect element according to the embodiment will be explained. The resonant magneto-resistance effect element shown in FIG. 1 includes many interfaces between ferromagnetic materials and non-magnetic materials. However, all voltages $V_o$ applied on the element are several mV or so, a relationship of e$V_0$<<kT is obtained, and thermal noise $v_{el}$ represented by the following Equation (8) becomes dominant as the electric noise.

$$v_{el}\sqrt{4kTR_0B} \quad (8)$$

Here, B denotes a bandwidth. Magnetic while noise in the device becomes 0.1 μV or less and it can be neglected. In a case of B=300 MHz, $R_0$=5Ω, and ΔV=0.1 mV, the SN ratio (SNR) is represented as SNR=ΔV/$v_{el}$, and SNR=20 (26 dB) is obtained.

As explained above, according to the embodiment, the magnetic white noise can be suppressed as far as possible.

Figure 8:
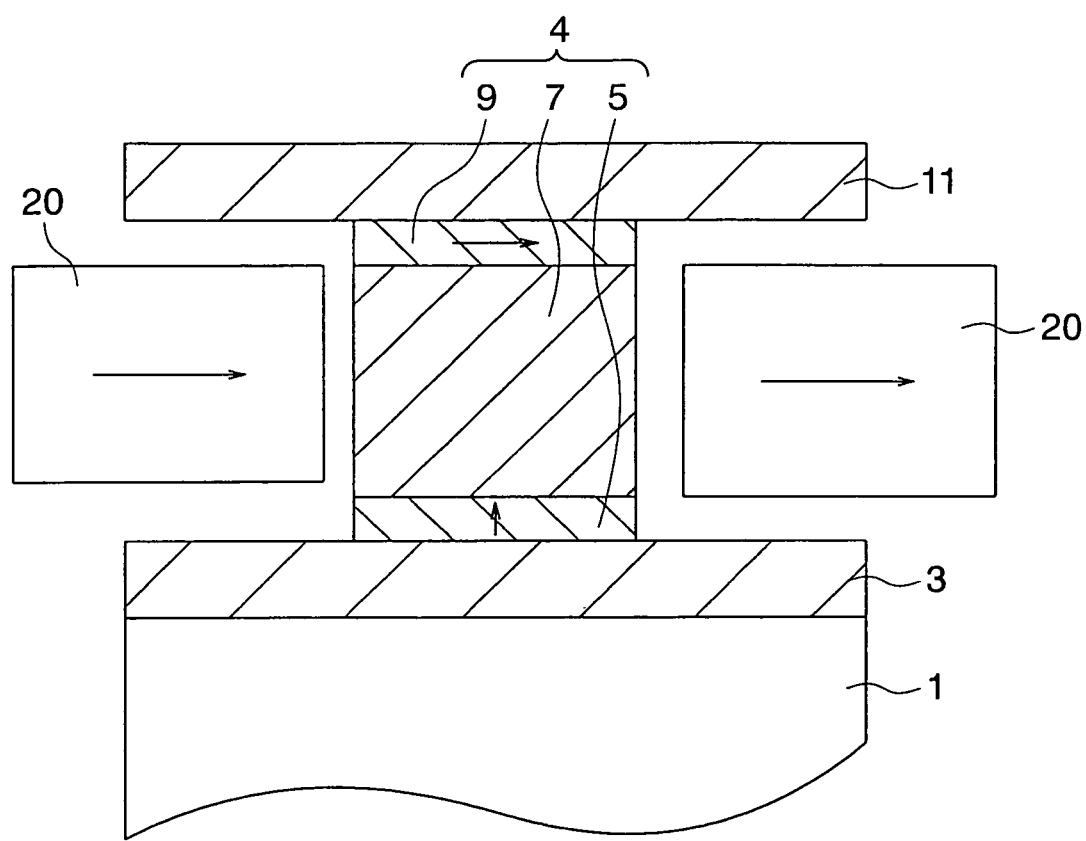
FIG. 8 is a sectional view showing a resonant magneto-resistance effect element according to modification of the first embodiment.

Incidentally, when the resonant magneto-resistance effect element according to the embodiment is used as a reproducing device of a magnetic head, as shown in FIG. 8, it is necessary to provide parallel magnetizing bias films 20 at side portions of the stacked film 4 constituted of the ferromagnetic layer 5, the non-magnetic layer 7, and the ferromagnetic layer 9.

Second Embodiment

The first embodiment is directed to the resonant magneto-resistance effect element where the ferromagnetic layer 9 and the ferromagnetic layer 5 whose magnetization direction is substantially perpendicular to a film plane are each provided as a single layer, and the stacked film 4 formed via the non-magnetic layer is provided as a single piece.

Figure 4A:
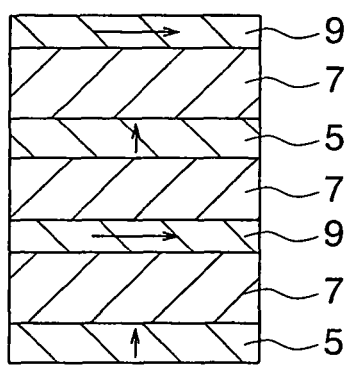
FIGS. 4A and 4B are sectional views showing a resonant magneto-resistance effect element according to a second embodiment of the invention.
Figure 4B:
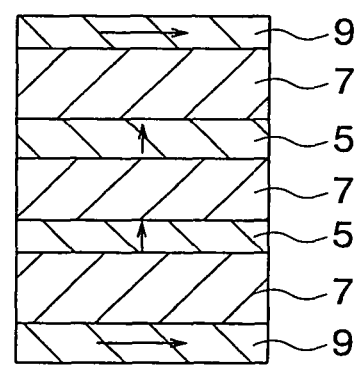

A resonant magneto-resistance effect element according to the second embodiment has a plurality of the stacked films 4 according to the first embodiment which have been stacked. By stacking a plurality of the stacked films according to the first embodiment, spin fluctuation generated by the ferromagnetic layers whose magnetization directions are substantially parallel to the film planes sequentially induce resonances in the ferromagnetic layers whose magnetization directions are substantially perpendicular to the film plane, so that a further larger output voltage ΔV can be obtained. As shown in FIG. 4A, it is preferable that the ferromagnetic layers 5 whose magnetization directions are substantially perpendicular to the film plane and the ferromagnetic layers 9 whose magnetization directions are substantially parallel to the film plane are alternately stacked on one another via the non-magnetic layers 7. As shown in FIG. 4B, however, even by employing such a constitution that a plurality of ferromagnetic layers 5 whose magnetization directions are substantially perpendicular to a film plane are stacked between two ferromagnetic layers 9 whose magnetization directions are substantially parallel to the film plane via non-magnetic layers 7, an output voltage can be increased as compared with that in the first embodiment.

The embodiment can suppress magnetic white noise as far as possible like the first embodiment.

Third Embodiment

Figure 9:
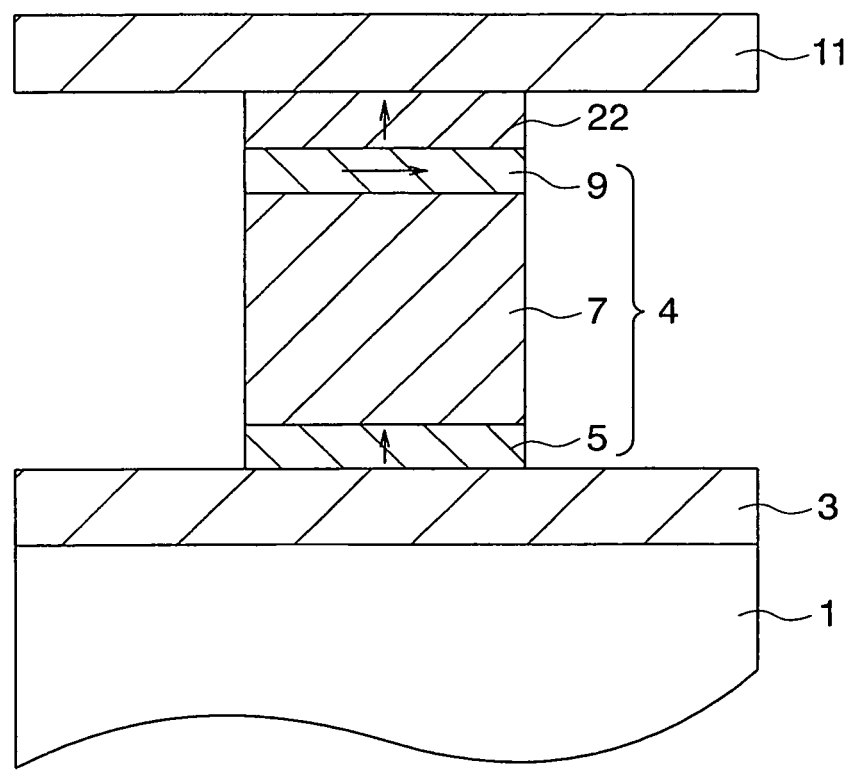
FIG. 9 is a sectional view showing a resonant magneto-resistance effect element according to a third embodiment of the invention.

Next, a resonant magneto-resistance effect element according to a third embodiment of the invention will be explained with reference to FIG. 9. A resonant magneto-resistance effect element of the embodiment has a constitution that a perpendicularly magnetizing bias film 22 is provided between the ferromagnetic layer 9 and the upper electrode 11 in the resonant magneto-resistance effect element according to the first or second embodiment.

In the first and second embodiments, change of external magnetic field applied within a plane of the ferromagnetic layer 5 is detected as change of a resonant frequency of the ferromagnetic layer 5 shown by Equation (7), but it is detected as change of a resonant frequency of the ferromagnetic layer 9 in the third embodiment. The smaller a difference between a shape anisotropy magnetic field $4\pi M$ and a crystalline anisotropy magnetic field $H_A$ perpendicular to the film plane, the larger change of a magnetic field frequency of a resonant frequency of the ferromagnetic layer 5 whose magnetization direction is substantially perpendicular to the film plane becomes. Therefore, when the resonant magneto-resistance effect element of the embodiment is used as a sensor, it is desirable that a relationship of $0 \text{ Oe} \leq (H_A - 4\pi M) \leq 500 \text{ Oe}$ is satisfied. Regarding the ferromagnetic layer 9, a difference between a shape anisotropy magnetic field $4\pi Ms$ and a crystalline anisotropy magnetic field $H_{A1}$ perpendicular to the film plane is made small, so that magnetic field change in a direction perpendicular to the film plane can be detected. In order to obtain a high sensitivity, it is desirable that a relationship of $0 \text{ Oe} \leq (4\pi M_s - H_{A1}) \leq 500 \text{ Oe}$ is satisfied. In that case, a further high sensitivity can be obtained by causing the resonant magneto-resistance effect element of the embodiment to function as a sensor in such a state that a direction of magnetization of the magnetic layer 9 is directed in a direction perpendicular to the film plane.

Figure 10:
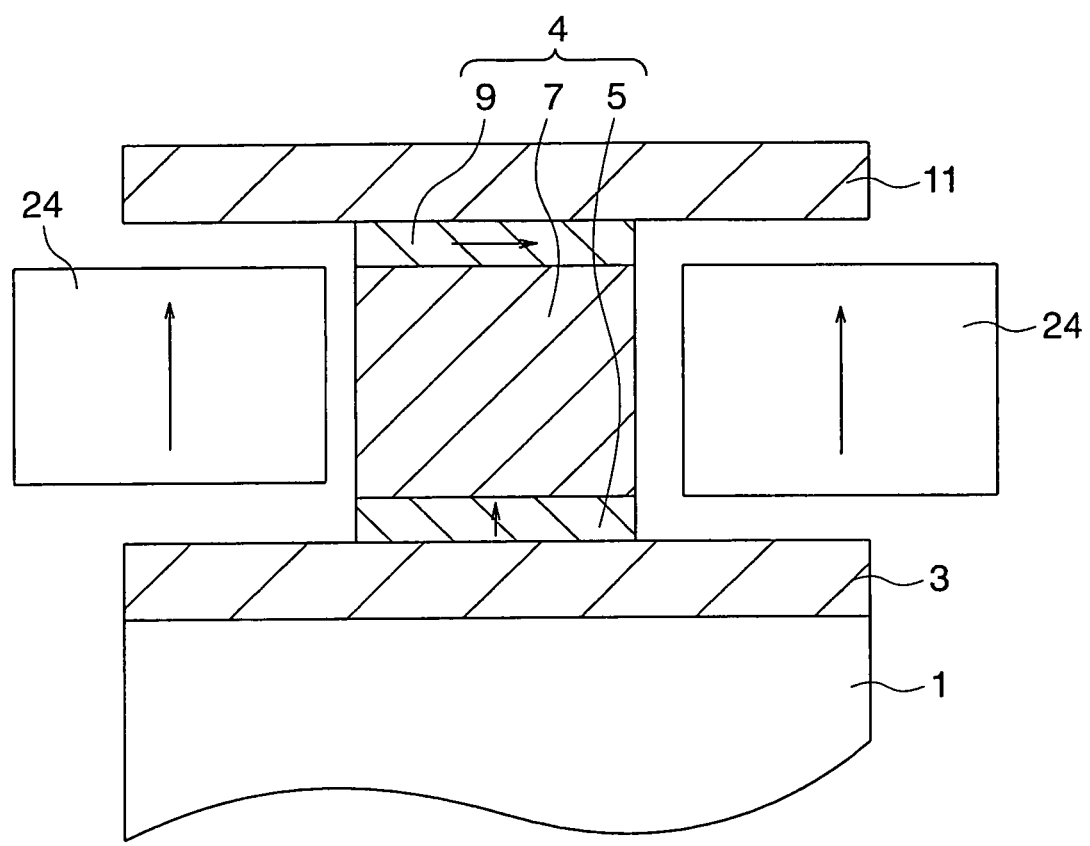
FIG. 10 is a sectional view showing a resonant magneto-resistance effect element according to modification of the third embodiment.

In the embodiment, the perpendicularly magnetizing bias film 22 is provided between the ferromagnetic layer 9 and the upper electrode 11, but perpendicularly magnetizing bias films 24 may be provided at side portions of the stacked film 4 constituted of the ferromagnetic layer 5, the non-magnetic layer 7, and the ferromagnetic layer 9, as shown in FIG. 10.

Fourth Embodiment

Next, a magnetic recording and reproducing apparatus according to a fourth embodiment of the invention will be explained. A magnetic head provided with the resonant magneto-resistance effect element according to any of the first to third embodiments explained with reference to FIGS. 1 to 10 as a reproducing device can be assembled to a magnetic head assembly of a recording and reproducing integral type to be mounted on a magnetic recording and reproducing apparatus, for example.

Figure 11:
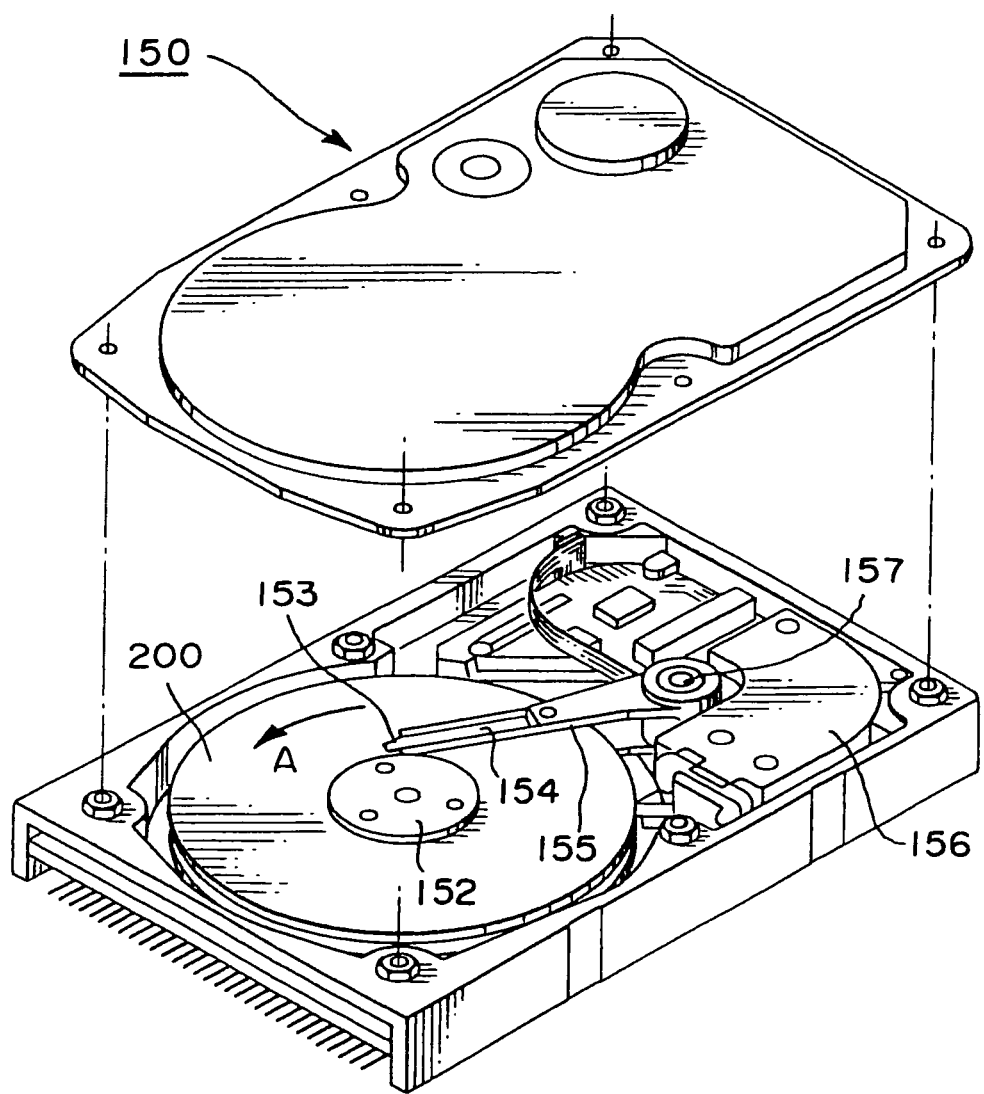
FIG. 11 is a perspective view of a principal portion showing a schematic constitution of a magnetic recording and reproducing apparatus.

FIG. 11 is a perspective view of a main portion illustrating a schematic constitution of such a magnetic recording and reproducing apparatus. That is, a magnetic recording and reproducing apparatus 150 according to the embodiment is an apparatus of a type using a rotary actuator. In FIG. 11, a magnetic disk 200 for longitudinal recording or perpendicular recording is attached to a spindle 152 and is rotated in a direction of arrow A by a motor (not shown) responding to a control signal from a driving device control unit (not shown). The magnetic disk 200 has a recording layer for longitudinal recording or perpendicular recording. A head slider 153 performing recording and reproducing of information stored in the magnetic disk 200 is attached to a distal end of a suspension 154 of a thin film type. Here, the head slider 153 is provided in the vicinity of its distal end with the resonant magneto-resistance effect element according to any of the above embodiments as a reproducing device.

When the magnetic disk 200 is rotated, a medium running face (ABS) of the head slider 153 is held with a predetermined floating amount from a surface of the magnetic disk 200.

The suspension 154 is connected to one end of an actuator arm 155 having a bobbin portion retaining a driving coil (not shown) and the like. A voice coil motor 156 which is a kind of a linear motor is provided on the other end of the actuator arm 155. The voice coil motor 156 is constituted of the driving coil (not shown) wound on the bobbin portion of the actuator arm 155, and a permanent magnet and an opposing yoke arranged in an opposing manner so as to sandwich the coil.

The actuator arm 155 is held by ball bearings (not shown) provided on upper and lower two portions on a fixing shaft 157, and it can be rotationally slid by the voice coil motor 156.

Figure 12:
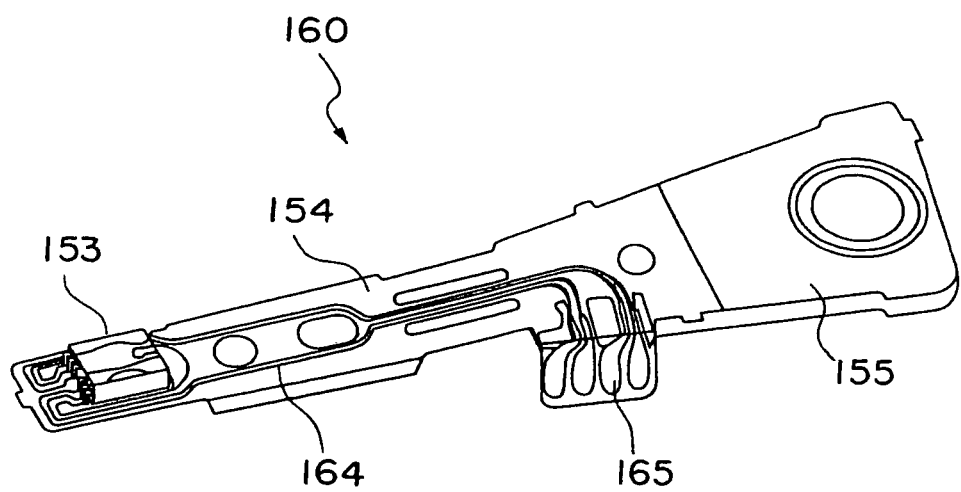
FIG. 12 is an enlarged perspective view of a magnetic head assembly positioned ahead of an actuator arm, viewed from a disk side.

FIG. 12 is an enlarged perspective view of a magnetic head assembly including the actuator arm 155, viewed from the disk side. That is, a magnetic head assembly 160 has the actuator arm 155 having the bobbin portion holding the driving coil, and the suspension 154 is connected to one end of the actuator arm 155.

The head slider 153 provided with either of the magnetic heads described above is attached to a distal end of the suspension 154. A combination with a reproducing head may be adopted. The suspension 154 has lead wires 164 for writing and reading a signal, and respective electrodes of the magnetic head assembled in the head slider 153 are electrically connected to the lead wires 164. In FIG. 12, reference numeral 165 denotes an electrode pad for the magnetic head assembly 160.

Next, Examples of the invention will be explained.

Example 1

Figure 5:
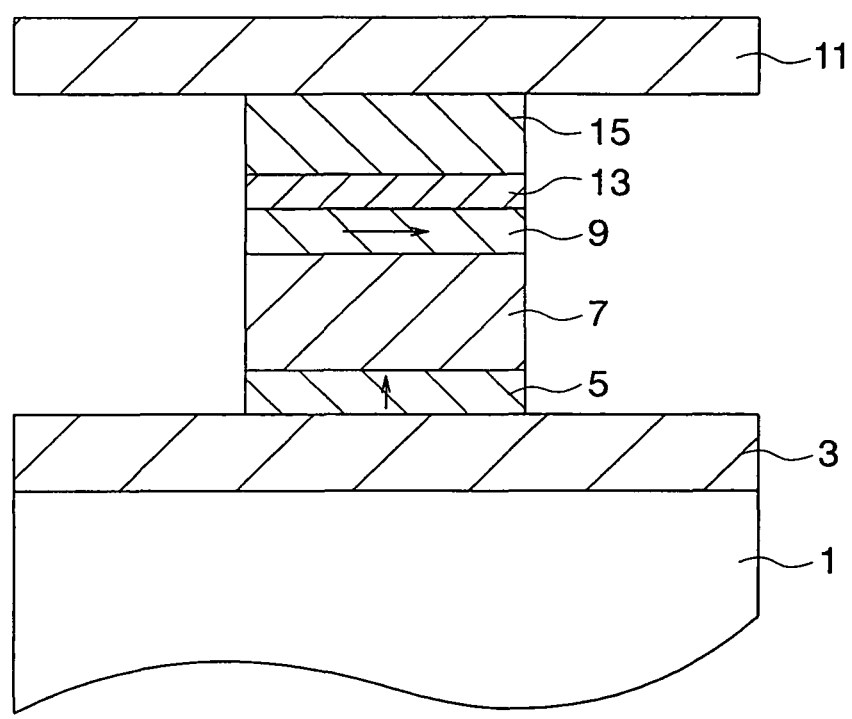
FIG. 5 is a sectional view showing a resonant magneto-resistance effect element according to Example 1 of the invention.

Next, a resonant magneto-resistance effect element according to Example 1 of the invention is shown in FIG. 5. FIG. 5 is a sectional view showing this Example. A resonant magneto-resistance effect element of Example 1 was manufactured in the following manner.

A stacked film was formed on a sapphire substrate 1 using sputter film forming and an electron beam lithography. The stacked film had a non-magnetic layer 3 made from Ru, a ferromagnetic layer 5 made from Co, a non-magnetic layer 7 made from Cu, a ferromagnetic layer 9 made from Fe, a non-magnetic layer 13 made from Cu, a non-magnetic layer 15 made from Ta, and a non-magnetic layer 11 made from Cu which were stacked in this order from the side of the substrate 1.

The respective layers were set in thickness such that the Ru layer 3 was about 100 nm, the Co layer 5 was about 1 nm, the Cu layer 7 was about 10 nm, the Fe layer 9 was about 1 nm, the Cu layer 13 was about 10 nm, the Ta layer 15 was about 20 nm, and the Cu layer 11 was about 100 nm. Respective joined areas among the ferromagnetic Co layer 5 and Fe layer 9, and the non-magnetic Cu layers 7 and 13 were set to be about $100 \times 100 \text{ nm}^2$, and $SiO_2$ was used as interlayer insulating films.

The Co layer 5 was a ferromagnetic layer whose magnetization direction was substantially perpendicular to a film plane, and magnetic uniaxial anisotropy was applied to the Fe layer 9 which was a ferromagnetic layer whose magnetization direction was substantially parallel to a film plane by forming the Fe layer 9 while applying magnetic field of about 1000 Oe in a direction parallel to the film plane. Magnetic characteristics of the Co layer 5 and the Fe layer 9 were examined by performing magnetic measurement and a ferromagnetic resonance measurement on a stacked film constituted of a Ru layer 3/a Co layer 5/a Cu layer 7 and a stacked film constituted of a Cu layer 7/an Fe layer 9/a Cu layer 13 manufactured under the same conditions as those in device manufacturing. Magnetization of the Co layer 5 was 920 G, magnitude of anisotropy magnetic field perpendicular to the film plane was 3500 Oe, magnetization of the Fe layer 9 was 1050 G, and magnitude of anisotropy magnetic field parallel to the film plane was 410 Oe.

Figure 6:
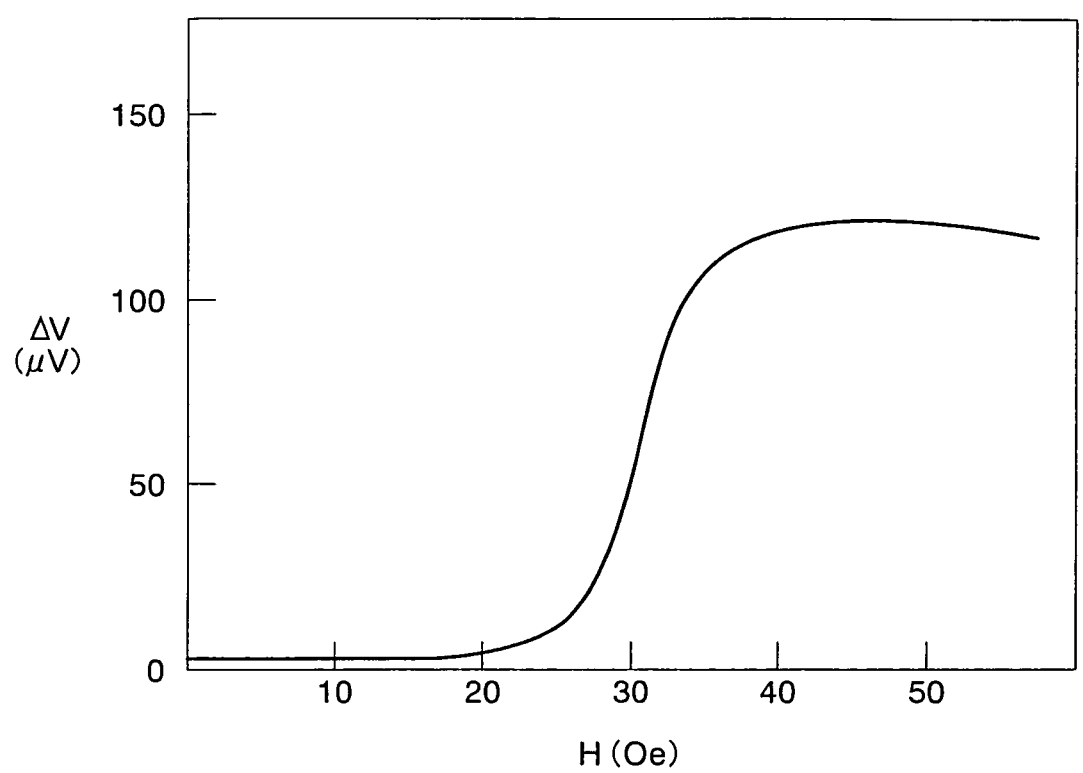
FIG. 6 is a graph showing such a fact that a resistance value of the resonant magneto-resistance effect element according to Example 1 depends on an external magnetic field.

A resonant frequency of the Co layer 5 was 9.8 GHz, and a resonant frequency of the Fe layer 9 was set to 9.55 GHz by adjusting bias magnetic field within the film plane. A resistance $R_0$ was 1Ω, a threshold current was 1.4 μA, and a resonant voltage ΔV was 0.12 mV at an OFF time, while an effective resistance at ON time was $(\Delta V/I_{th})+R_0=87\Omega$. When external magnetic field was applied in such a state that current of 2 μA was being flowed in the resonant magneto-resistance effect element of Example 1, the resonant frequency of the Fe layer 9 changed, so that ΔV was changed as shown in FIG. 6. Thus, it was understood that the resonant magneto-resistance effect element of Example 1 functioned as a magnetic sensor.

Example 2

Figure 7:
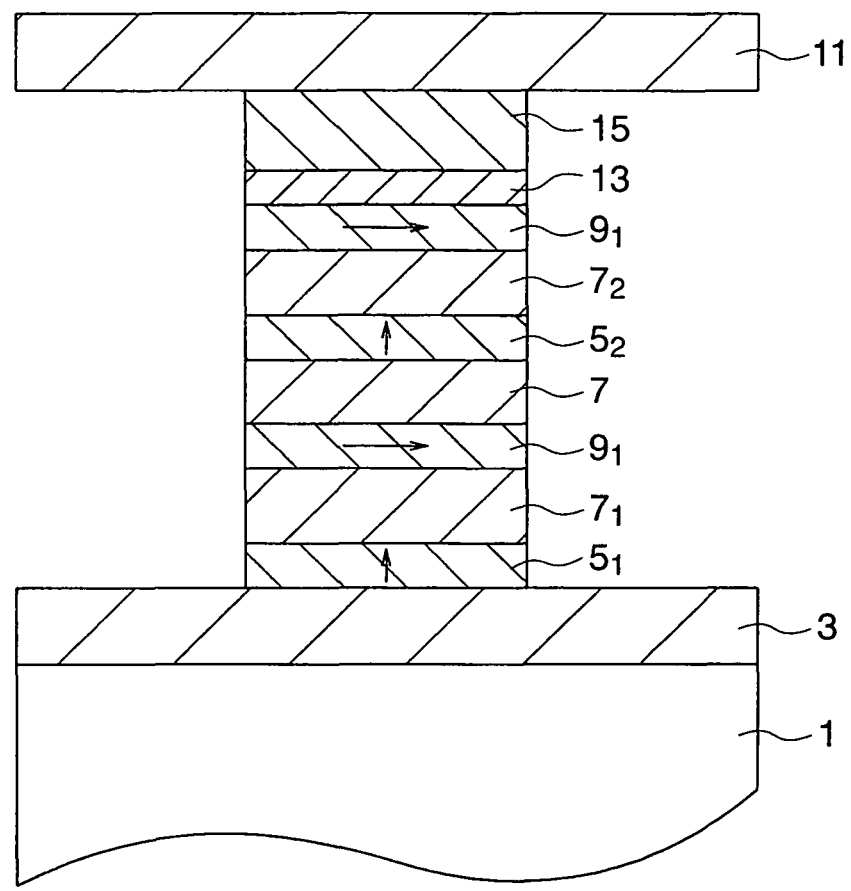
FIG. 7 is a sectional view showing a resonant magneto-resistance effect element according to Example 2 of the invention.

Next, a resonant magneto-resistance effect element according to Example 2 of the invention is shown in FIG. 7. FIG. 7 is a sectional view showing a resonant magneto-resistance effect element of the Example 2. The resonant magneto-resistance effect element of Example 2 had a constitution that two stacked structures, each being constituted of the ferromagnetic layer 5, the non-magnetic layer 7, and the ferromagnetic layer 9 according to Example 1, were stacked one on another. The resonant magneto-resistance effect element of Example 2 was manufactured as follows:

A stacked film was formed on a sapphire substrate 1 using sputter film forming and an electron beam lithography like the case of Example 1. The stacked film had a non-magnetic layer 3 made from Ru, a ferromagnetic layer $5_1$ made from Co, a non-magnetic layer $7_1$ made from Cu, a ferromagnetic layer $9_1$ made from NiFe, a non-magnetic layer 7 made from Cu, a ferromagnetic layer $7_2$ made from Cu, a ferromagnetic layer $9_2$ made from NiFe, a non-magnetic layer 13 made from Cu, a non-magnetic layer 15 made from Ta, and a non-magnetic layer 11 made from Cu which were stacked in this order from the substrate 1.

Respective layers were set in thickness such that the Ru layer 3 was about 100 nm, the Co layers $5_1$ and $5_2$ were about 1 nm, the Cu layers $7_1$, 7, and $7_2$ were about 5 nm, the NiFe layers $9_1$ and $9_2$ were about 1 nm, the Cu layer 13 was about 10 nm, the Ta layer 15 was about 20 nm, and the Cu layer 11 was about 100 nm. The device size was set to about 100×100 nm² and SiO₂ was used as interlayer insulating films.

The Co layers $5_1$ and $5_2$ were magnetic layers whose magnetization directions were substantially perpendicular to the film plane, and magnetic uniaxial anisotropy was applied to the NiFe layers $9_1$ and $9_2$ which were magnetic layers whose magnetization directions were substantially parallel to the film plane by forming the NiFe films while applying magnetic field of about 1000 Oe in parallel to the film plane. Magnetic characteristics of the Co layers $5_1$ and $5_2$ and the NiFe layers $9_1$ and $9_2$ were examined by performing magnetization measurement and ferromagnetic resonance measurement on a stacked film of a Ru layer 3/a Co layer $5_1$/a Cu layer $7_1$ and a stacked film of a Cu layer $7_1$/an NiFe layer $9_1$/a Cu layer 7 which were manufactured under the same conditions as those in device manufacturing. Magnetization of the Co layer $5_1$ was 920 G, magnitude of anisotropy magnetic field perpendicular to the film plane was 3500 Oe, magnetization of the NiFe layer $9_1$ was 810 G, and magnitude of inplane anisotropy magnetic field was 220 Oe.

Resonant frequencies of the Co layers $5_1$ and $5_2$ were 9.8 GHz, and resonant frequencies of the NiFe layers $9_1$ and $9_2$ were set to 9.6 GHz by adjusting bias magnetic field within the film plane. A resistance $R_0$ was 1.3Ω, a threshold current was 1.8 μA, and a resonant voltage ΔV was 0.21 mV at an OFF time, while an effective resistance at ON time was $(\Delta V/I_{th})+R_0=118\Omega$. The resonant frequency could be elevated by increasing the number of stackings.

Example 3

An element with a similar structure except that the Fe layer with a thickness of 1 nm in Example 1 was replaced by a Co film (an inplane magnetized film) with a thickness of a 1.2 nm was manufactured according to a method similar to that in Example 1. It was found from magnetization measurement that a difference $(4\pi M_s - H_{A1})$ between a shape anisotropy magnetic field $4\pi Ms$ of the Co film and a crystalline anisotropy magnetic field $H_{A1}$ perpendicular to a film plane was 3500 Oe. When current was flowed in a element such a state that bias magnetic field of 500 Oe was applied on a film plane of the element perpendicularly thereto and magnetization of the Co layer with a thickness of 1.2 nm was set to be perpendicular to the film plane, a resonant voltage of 0.15 mV was observed at a current of 2 μA or less. Further, when external magnetic field was applied to the element in a direction reverse to the bias magnetic field, it was observed that the resonant voltage was decreased to 0.5 mV at an application time of magnetic field with 30 Oe, and it was confirmed that the element functioned as a magnetic sensor for magnetic field perpendicular to a film plane.

As described above, the resonant magneto-resistance effect element according to each Example can be manufactured using an ordinary film forming technique, and it has a feature that, even if a joined area in a device is decreased, a sensitivity and an SN Ratio are not lowered, so that a high density and a high magnetic resistance change can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A resonant magneto-resistance effect element comprising:
   a first stacked structure comprising: a first magnetic film whose magnetization direction is substantially perpendicular to a stacking direction of the first stacked structure; a second magnetic film whose magnetization direction is substantially parallel to the stacking direction of the first stacked structure; and a first non-magnetic film provided between the first and second magnetic films;
   a second stacked structure comprising: a third magnetic film whose magnetization direction is substantially perpendicular to a stacking direction of the second stacked structure; a fourth magnetic film whose magnetization direction is substantially parallel to the stacking direction of the second stacked structure; and a second non-magnetic film provided between the third and fourth magnetic films; and a third non-magnetic film provided between the first stacked structure and the second stacked structure, wherein by flowing a current between the first and second stacked structures via the third non-magnetic film, in a direction parallel to the stacking directions of the first and second stacked structures, the first magnetic film generates spin fluctuation of conduction electrons and the spin fluctuation of conduction electrons is injected into the second magnetic film via the first non-magnetic film, thereby inducing magnetic resonance on the second magnetic film, and/or the third magnetic film generates spin fluctuation of conduction electrons and the spin fluctuation of conduction electrons is injected into the fourth magnetic film via the second non-magnetic film, thereby inducing magnetic resonance on the fourth magnetic film.

2. A resonant magneto-resistance effect element according to claim 1, wherein at least one of the first to fourth magnetic films has a single magnetic domain.

3. A resonant magneto-resistance effect element according to claim 1, wherein a thickness of each of the first to fourth magnetic films is 0.1 nm or more and 3 nm or less.

4. A resonant magneto-resistance effect element according to claim 1, wherein the first to fourth magnetic films are each a single film.

5. A resonant magneto-resistance effect element according to claim 1, wherein a difference in magnitude between a shape anisotropy magnetic field of each of the second and fourth magnetic films and a crystalline anisotropy magnetic field in a direction perpendicular to the film plane is 0 Oe or more but 500 Oe or less.

6. A resonant magneto-resistance effect element according to claim 1, wherein the third non-magnetic film is provided on the first magnetic film in the first stacked structure, the fourth magnetic film in the second stacked structure is provided on the third non-magnetic film.

7. A resonant magneto-resistance effect element according to claim 6, further comprising a first electrode provided on opposite side of the second magnetic film from the first non-magnetic film and a second electrode provided on opposite side of the third magnetic film from the second non-magnetic film.

8. A resonant magneto-resistance effect element according to claim 7, further comprising a perpendicularly magnetizing bias film provided between the second magnetic film and the first electrode, the perpendicularly magnetizing bias film providing magnetic field substantially perpendicular to its film plane.

9. A resonant magneto-resistance effect element according to claim 1, wherein the third non-magnetic film is provided on the second magnetic film of the first stacked structure, the third magnetic film in the second stacked structure is provided on the third non-magnetic film.

10. A magnetic head comprising a resonant magneto-resistance effect element according to claim 1 as a reproducing element.

11. A magnetic recording and reproducing apparatus comprising a magnetic head according to claim 10.

12. A resonant magneto-resistance effect element according to claim 1, wherein the first magnetic film is provided on the side of the third non-magnetic film, the second magnetic film is provided on the side opposite to the third non-magnetic film, the fourth magnetic film is provided on the side of the third non-magnetic film, and the third magnetic film is provided on the side opposite to the third non-magnetic film.

13. A resonant magneto-resistance effect element according to claim 1, wherein the second magnetic film is provided on the side of the third non-magnetic film, the first magnetic film is provided on the side opposite to the third non-magnetic film, the fourth magnetic film is provided on the side of the third non-magnetic film, and the third magnetic film is provided on the side opposite to the third non-magnetic film.

* * * * *